United States Patent
Joshi et al.

(10) Patent No.: US 9,692,375 B2
(45) Date of Patent: Jun. 27, 2017

(54) BOOSTING AMPLIFIER GAIN WITHOUT CLIPPING SIGNAL ENVELOPE

(71) Applicant: QUALCOMM Incorporated, San Diego, CA (US)

(72) Inventors: Alok Prakash Joshi, Bangalore (IN); Gireesh Rajendran, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/856,964

(22) Filed: Sep. 17, 2015

(65) Prior Publication Data

US 2017/0033750 A1    Feb. 2, 2017

(30) Foreign Application Priority Data

Jul. 30, 2015 (IN) ............................ 3920/CHE/2015

(51) Int. Cl.
*H03F 3/45* (2006.01)

(52) U.S. Cl.
CPC .................. *H03F 3/45183* (2013.01); *H03F 2203/45038* (2013.01); *H03F 2203/45154* (2013.01)

(58) Field of Classification Search
CPC ............. H03F 3/45; H03F 1/342; H03F 1/483

USPC ................................ 330/253, 260, 261, 292
See application file for complete search history.

(56) References Cited

U.S. PATENT DOCUMENTS

| | | | |
|---|---|---|---|
| 4,560,921 A | 12/1985 | Yamatake | |
| 5,668,468 A | 9/1997 | Cargill | |
| 7,248,116 B2 | 7/2007 | Chiu | |
| 7,629,835 B2 | 12/2009 | Arai | |
| 7,696,822 B2 | 4/2010 | Wang | |
| 7,936,217 B2 | 5/2011 | Deng et al. | |
| 8,264,282 B1 * | 9/2012 | Riekki | H03F 1/301 330/260 |
| 8,390,378 B2 | 3/2013 | Gnai et al. | |
| 2011/0193632 A1 | 8/2011 | Kato | |

OTHER PUBLICATIONS

International Search Report—PCT/US2016/043672—ISA/EPO—Oct. 11, 2016.
Written Opinion—PCT/US2016/043672—ISA/EPO—Oct. 11, 2016.

* cited by examiner

*Primary Examiner* — Steven J Mottola
(74) *Attorney, Agent, or Firm* — Haynes and Boone, LLP

(57) ABSTRACT

Disclosed is a circuit having a differential stage comprising a pair or transistors. The transistors are biased by respective bias transistors. Each bias transistor has a respective feedback network configured to reduce transconductance of the bias transistor, to increase a gain of the differential stage.

18 Claims, 8 Drawing Sheets

BOOSTING AMPLIFIER GAIN WITHOUT CLIPPING SIGNAL ENVELOPE

CROSS REFERENCE TO RELATED APPLICATIONS

Pursuant to 35 U.S.C. §119(a), this application is entitled to and claims the benefit of the filing date of Patent Application No. 3920/CHE/2015 filed Jul. 30, 2015 in India, the content of which is incorporated herein by reference in its entirety for all purposes.

BACKGROUND

Differential amplifiers are used to amplify a differential voltage between two input signals. Some conventional designs offer limited capability. For example, some differential amplifier designs may have limited linear operating ranges. As a result, a linear output may only be achievable for input signals having a narrow range of input voltages. Input signals with varying envelopes may cause clipping of the peak output signal, which can result in non-linear output (distortion). Distortions may create out-of-band emissions, which may interfere with other electronic circuits. Mismatches in some components that comprise the differential amplifier can also create errors in linearity and degrade signal gain.

SUMMARY

In accordance with aspects of the present disclosure, a circuit may include a differential stage comprising a first transistor and a second transistor. The circuit may further include a first bias transistor having an output terminal electrically connected to a control terminal of the first transistor, and a second bias transistor having an output terminal electrically connected to a control terminal of the second transistor. A first feedback network may be electrically connected between a control terminal and the output terminal of the first bias transistor, and likewise, a second feedback network may be electrically connected between a control terminal and the output terminal of the second bias transistor.

In some aspects, the first and second feedback networks may alter respective transconductances of the first and second bias transistors. In some aspects, the first and second feedback networks may reduce the respective transconductances of the first and second bias transistors.

In some aspects, the first and second transistors may be NPN transistors, wherein the output terminals of the first and second transistors are source terminals of the first and second transistors.

In some aspects, the first and second feedback networks, each, may include a capacitive feedback circuit. The capacitive feedback circuits may include a variable capacitor.

In some aspects, the first feedback network may include a parasitic capacitance of the first bias transistor, and the second feedback network includes a parasitic capacitance of the second bias transistor.

In some aspects, the first feedback network may include a capacitor electrically connected between the control terminal and output terminal of the first bias transistor. An impedance of the first transistor may be increased by a factor $$\frac{C}{C_{par}},$$

where C is a capacitance of the capacitor and Cpar is a parasitic capacitance of the first transistor.

In some aspects, the circuit may further comprise a mixer circuit electrically connected to the first and second differential inputs, and a power amplifier electrically connected to the first and second differential outputs.

In some aspects, the circuit may further comprise a first current source to set a DC operating point of the first transistor and a second current source to set a DC operating point of the second transistor.

In accordance with aspects of the present disclosure, a method in a circuit may include receiving first and second input signals at respective control terminals of first and second transistors of a differential stage and providing first and second output signals at respective output terminals of the first and second transistors. The method may further include biasing the first transistor using a first biasing transistor and biasing the second transistor using a second biasing transistor. The method may further include reducing a transconductance of the first biasing transistor and a transconductance of the second biasing transistor to increase a gain characteristic of the differential stage.

In some aspects, reducing a transconductance of the first biasing transistor may include providing a feedback signal between an output terminal of the first biasing transistor and a control terminal of the first biasing transistor.

In some aspects, the method may further comprise generating the feedback signal using a capacitive feedback network.

In some aspects, reducing a transconductance of the first biasing transistor may include providing a feedback signal between a feedback network comprising a capacitor electrically connected between a control terminal and an output terminal of the first bias transistor, wherein an impedance of the first transistor is increased by a factor, where C is a capacitance of the capacitor and Cpar is a parasitic capacitance of the first transistor. The capacitor may be a variable capacitor.

In some aspects, the method may further comprise receiving the first and second input signals from a mixer circuit and providing the first and second output signals to a power amplifier.

In accordance with some aspects of the present disclosure, a circuit may include means for receiving first and second input signals at respective control terminals of first and second transistors of a differential stage, means for providing first and second output signals at respective output terminals of the first and second transistors, means for biasing the first transistor using a first biasing transistor, means for biasing the second transistor using a second biasing transistor, and means for reducing a transconductance of the first biasing transistor and a transconductance of the second biasing transistor to increase a gain characteristic of the differential stage.

In some aspects, the means for reducing a transconductance of the first biasing transistor comprises a feedback signal between an output terminal of the first biasing transistor and a control terminal of the first biasing transistor.

In some aspects, the means for reducing a transconductance of the first biasing transistor may comprise a capacitive feedback network.

In some aspects, the means for reducing a transconductance of the first biasing transistor may include a feedback network comprising a capacitor electrically connected between a control terminal and an output terminal of the first bias transistor, wherein an impedance of the first transistor is increased by a factor $$\frac{C}{C_{par}},$$

where C is a capacitance of the capacitor and Cpar is a parasitic capacitance of the first transistor. The capacitor may be a variable capacitor.

In some aspects, the circuit may further comprise a mixer circuit electrically connected to the means for receiving first and second input signals and a power amplifier electrically connected to the means for providing first and second output signals.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1A:
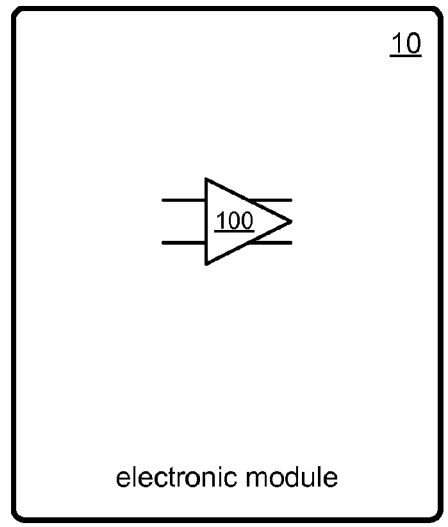
FIGS. 1A, 1B, and 1C show use cases for differential amplifiers in accordance with the present disclosure.

FIG. 1A shows an example of an electronic module 10 that may incorporate a differential amplifier 100 in accordance with the present disclosure. In some embodiments, the electronic module 10 may be an electronic device such as a smartphone, computer tablet, and so on that includes various circuits and components including differential amplifier 100. In other embodiments, the electronic module 10 may represent circuitry or components that comprise an electronic device. Merely as an example, the electronic module 10 may be radio frequency (RF) circuitry (e.g., a transceiver chip) that uses differential amplifier 100. As another example, the electronic module 10 may be an automatic gain control circuit that includes differential amplifier 100, and so on.

Figure 1B:
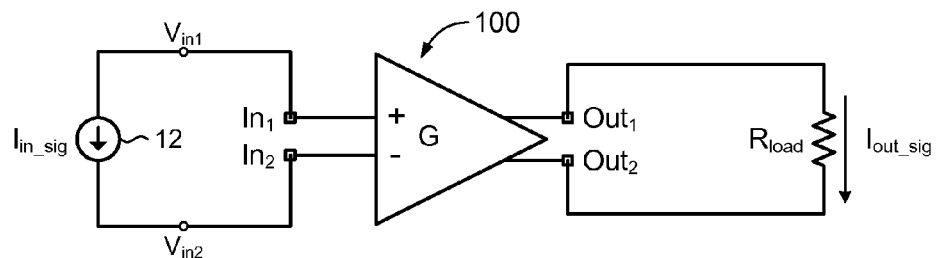

FIG. 1B shows some naming conventions used to describe the differential amplifier 100. In some embodiments, the differential amplifier 100 may be a fully differential amplifier. The present disclosure will describe a fully differential amplifier configuration. However, it will be appreciated from the discussion to follow that the present disclosure may be applicable to single-ended output differential amplifier configurations. Continuing with FIG. 1B, in some embodiments, the (fully) differential amplifier 100 may include differential inputs $In_1$ and $In_2$, and differential outputs $Out_1$ and $Out_2$.

The differential inputs $In_1$, $In_2$ may be connected to circuitry 12 in the electronic module 10 represented by a current source. The circuitry 12 may provide input voltages $V_{in1}$, $V_{in2}$ and input current $I_{in\_sig}$ to the differential amplifier 100. The differential outputs $Out_1$, $Out_2$ may be connected to circuitry $R_{load}$ in the electronic module 10. The differential outputs $Out_1$, $Out_2$ may source current $I_{out\_sig}$ to $R_{load}$.

Figure 1C:
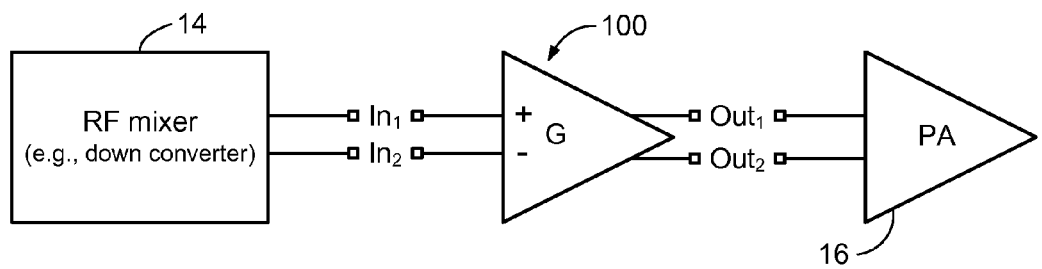

FIG. 1C shows an illustrative example of circuitry that the differential amplifier 100 may be used with. Merely as an example, differential amplifier 100 may be used in a transceiver circuit (e.g., in electronic module 10). For example, an RF mixer 14 in the receiver portion of the transceiver circuit may output down converted signals to be amplified by differential amplifier 100. The output of the differential amplifier 100 may drive a power amplifier 16 to produce a signal that can be used further upstream in the electronic module 10.

Figure 2:
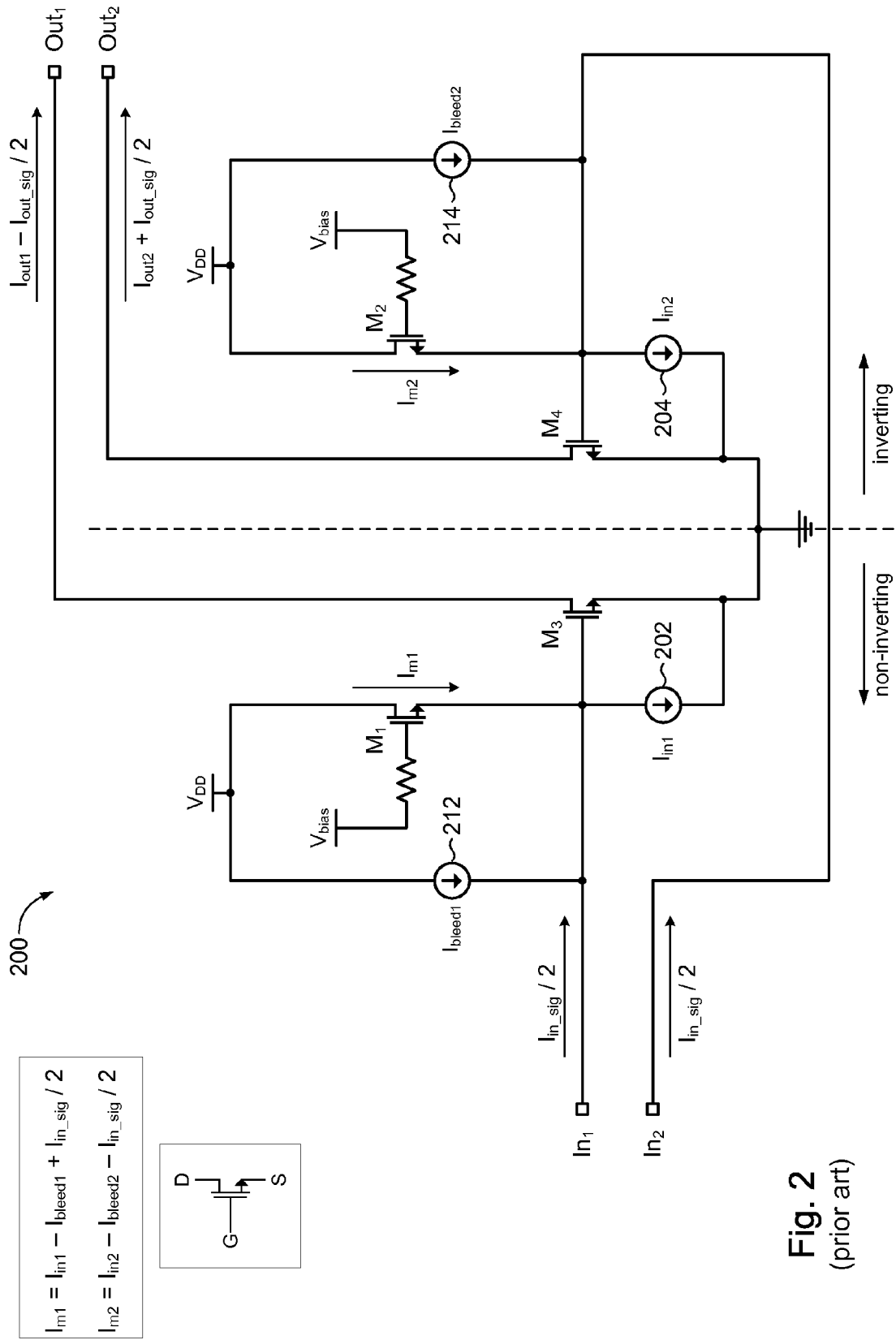
FIG. 2 illustrates a design for a differential amplifier.

FIG. 2 shows a typical design of a differential amplifier 200. The differential amplifier 200 may include a differential stage comprising transistors $M_3$, $M_4$. The differential inputs $In_1$, $In_2$ may be electrically connected to respective transistors $M_3$, $M_4$, and in particular to the gates G (control terminals) of $M_3$, $M_4$. The differential outputs $Out_1$, $Out_2$ may be electrically connected to respective drains D (output terminals) of transistors $M_3$, $M_4$. The transistor terminal designations are identified in the inset shown in FIG. 2.

The differential amplifier 200 may include a bias transistor $M_1$ connected to the gate G of $M_3$ to bias the transistor $M_3$. A current source 202 connected to the gate of transistor $M_3$ may provided a DC bias current through bias transistor $M_1$ to set a DC operating point of $M_3$. Likewise, the differential amplifier 200 may include a bias transistor $M_2$ connected to the gate G of $M_4$. A current source 204 connected to the gate of transistor $M_2$ may provided a DC bias current $I_{in2}$ through bias transistor $M_2$ to set a DC operating point of $M_4$.

The differential amplifier 200 may include current sources 212, 214 connected to the respective gates G of transistors $M_3$, $M_4$. The current sources 212, 214 may provide a current, sometimes referred to as bleed current, to effectively increase the gain of the differential amplifier 200. As will be explained below, the bleed currents $I_{bleed1}$, $I_{bleed2}$ can effectively reduce the transconductances $gm_1$, $gm_2$ of the bias transistors $M_1$, $M_2$, and hence increase the gain of the differential amplifier 200.

The gain of the differential amplifier 200, on the non-inverting side for example, may be expressed in accordance with the following. A similar analysis may be applied for the inverting side of differential amplifier 200.

$$I_{out1\_sig} = I_{out1} - \frac{I_{out\_sig}}{2}, \quad \text{Eqn. 1}$$

$$I_{out1} = \frac{gm3}{gm1} \times I_{in1},$$

$$I_{out1\_sig} = \frac{gm3}{gm1} \times I_{m1},$$

$$I_{m1} = I_{in1} - I_{bleed1} + I_{in\_sig}/2,$$

where $I_{out1\_sig}$ is the output current at the $Out_1$ terminal,
$I_{out1}$ is the quiescent output current at the $Out_1$ terminal,
$I_{out\_sig}$ is the output signal current (FIG. 1B)
$I_{in\_sig}$ is the input signal current (FIG. 1B),
$I_{m1}$ is the current through $M_1$,
$I_{in1}$ is the DC bias current (current source 202),
$I_{bleed1}$ is a bleed current (current source 212),
$gm_1$ is the transconductance of $M_1$, and
$gm_3$ is the transconductance of $M_3$.

Consider the behavior of bias transistor $M_1$ for a given DC bias current $I_{in1}$ through $M_1$ and a given swing of input current $I_{in\_sig}/2$ at input $In_1$. As noted above, the DC bias current through bias transistor $M_1$ is $I_{in1}$. Suppose, $I_{in1}$ is set at 1 mA, and the signal peak of $I_{in\_sig}/2$ is 1 mA. The current $I_{m1}$ through bias transistor $M_1$ will swing from $I_{in1}+I_{in\_sig}/2=2$ mA to $I_{in1}-I_{in\_sig}/2=0$ mA. Suppose this range of $I_{m1}$ lies within the linear operating range for bias transistor $M_1$.

In order to increase the gain, for example on the non-inverting side of the differential amplifier 200, Eqn. 1 above shows this may be achieved by decreasing the transconductance $gm_1$ of bias transistor $M_1$. This can be conventionally accomplished by using bleed current $I_{bleed1}$ from current source 212. In a typical small signal device model for bias transistor $M_1$, the transconductance $gm_1$ is approximately proportional to the DC bias current through bias transistor $M_1$. By introducing $I_{bleed1}$, the DC bias current through bias transistor $M_1$ can be reduced by an amount ($I_{in1}-I_{bleed1}$). The transconductance $gm_1$ of bias transistor $M_1$, accordingly, can be reduced by a factor $$\frac{I_{in1} - I_{bleed1}}{I_{in1}}.$$

Consider the behavior of bias transistor $M_1$ where $I_{bleed1}$ is 0.5 $I_{in1}$. The DC bias current through bias transistor $M_1$ becomes 0.5 $I_{in1}$, which will reduce the transconductance $gm_1$ by a factor of 0.5 (as compared to not having the bleed current $I_{bleed1}$), and hence increase the gain of amplifier 200 by a factor of 2. Reducing the DC bias current through bias transistor $M_1$ in order to reduce its transconductance $gm_1$, however, shifts the DC operating point of bias transistor $M_1$. Thus, given the same signal peak for input current $I_{in\_sig}/2$ of 1 mA, the current $I_{m1}$ through bias transistor $M_1$ will swing from 0.5 $I_{in1}+I_{in\_sig}/2=1.5$ mA to 0.5 $I_{in1}-I_{in\_sig}/2=-0.5$ mA. Since the bias transistor $M_1$ does not conduct current in the negative direction, differential amplifier 200 may exhibit signal clipping or some distortion during a portion of the input signal. A similar analysis and conclusion may be reached for the inverting side of differential amplifier 200.

Shifting the DC operating point to reduce the transconductance $gm_1$ affects the response of bias transistor $M_1$ to the same input current $I_{in\_sig}/2$, which did not show distortion at a lower gain but exhibits distortion at a higher gain. For signals with varying envelopes, changing the DC operating point of bias transistor $M_1$ by bleeding off current from current source 202 to realize higher gain (on the non-inverting side) can incur a risk of clipping, which can degrade linearity of the differential amplifier 200 and can create out-of-band emissions. In addition, the use of the current source $I_{bleed1}$ may introduce additional noise to the differential amplifier 200. Moreover, mismatches between the current source $I_{in1}$ and the current source $I_{bleed1}$ can further introduce errors in signal gain and linearity. A similar conclusion may be reached for the inverting side of differential amplifier 200.

Figure 3:
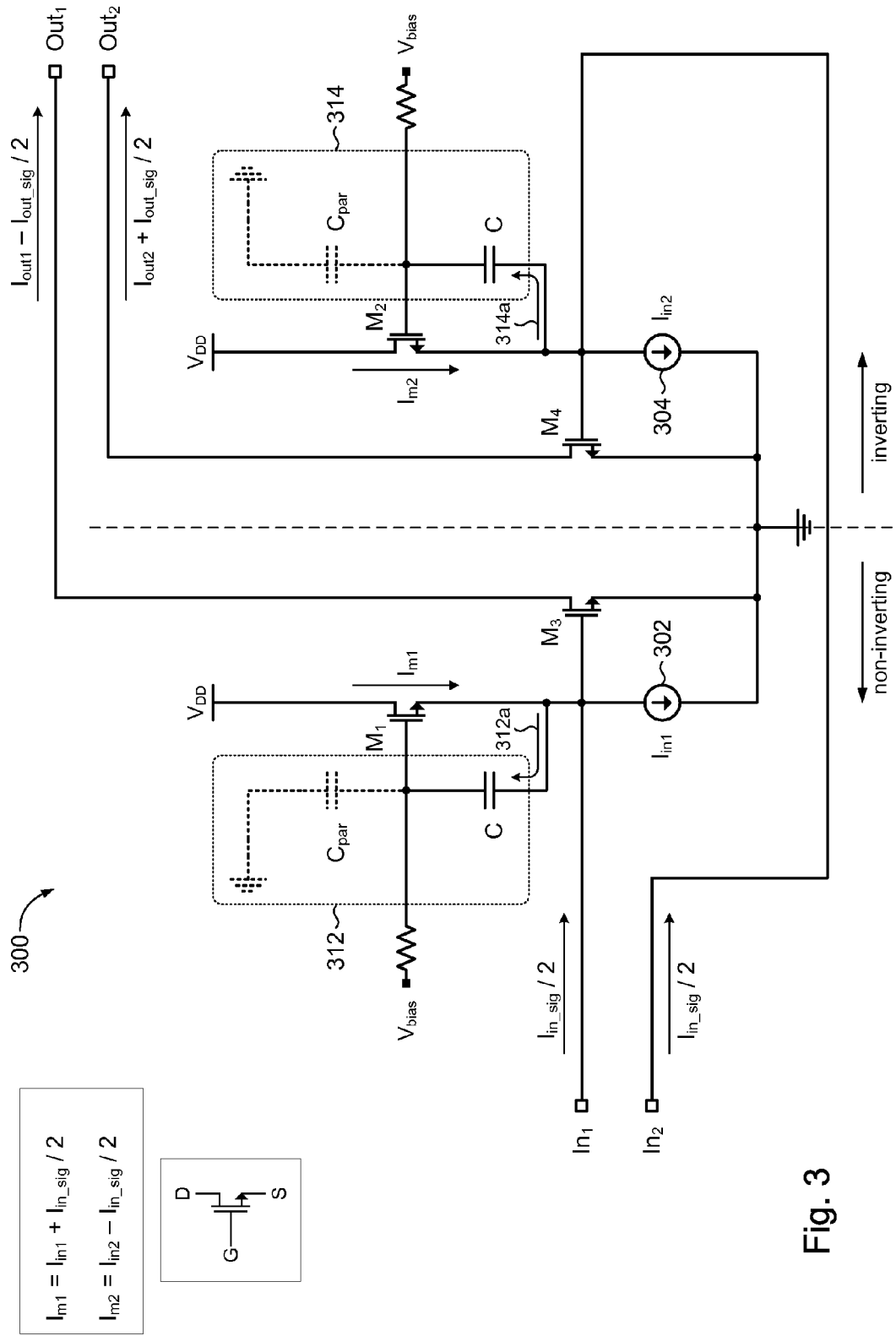
FIGS. 3 and 3A illustrate a differential amplifier design in accordance with some aspects of the present disclosure.

FIG. 3 illustrates a differential amplifier 300 in accordance with the present disclosure. The differential amplifier 300 may include a differential stage comprising transistors $M_3$, $M_4$. The differential stage may include means for receiving first and second input signals. In some embodiments, for example, the differential stage may include differential inputs $In_1$, $In_2$ electrically connected to respective transistors $M_3$, $M_4$, and in particular to the gates G (control terminals) of $M_3$, $M_4$. The differential stage may include means for providing first and second output signals. In some embodiments, for example, the differential stage may include differential outputs $Out_1$, $Out_2$ electrically connected to respective drains D (output terminals) of transistors $M_3$, $M_4$. The transistor terminal designations are identified in the inset shown in FIG. 3.

The differential amplifier 300 may include means for biasing transistor $M_3$. In some embodiments, for example, the differential amplifier 300 may include a bias transistor $M_1$ connected to the gate G of $M_3$ to bias the transistor $M_3$. A current source 302 connected to the gate of transistor $M_3$ may provided a DC bias current through bias transistor $M_1$ to set a DC operating point of $M_3$. Likewise, the differential amplifier 300 may include means for biasing transistor $M_4$. In some embodiments, for example, the differential amplifier 300 may include a bias transistor $M_2$ connected to the gate G of $M_4$. A current source 304 connected to the gate of transistor $M_2$ may provided a DC bias current $I_{in2}$ through bias transistor $M_2$ to set a DC operating point of $M_4$.

In accordance with the present disclosure, the differential amplifier 300 may include means for reducing a transconductance of the biasing transistor $M_1$. In some embodiments, for example, differential amplifier 300 may include, on the non-inverting side, a capacitive feedback network 312 electrically connected to the bias transistor $M_1$ to provide a feedback signal (path) 312a between the source S and gate G of bias transistor $M_1$. In some embodiments, for example, the capacitive feedback network 312 may include a capacitor C electrically connected between the source S and gate G of bias transistor $M_1$. The capacitive feedback network 312 may include the parasitic capacitance $C_{par}$ of bias transistor $M_1$. In some embodiments, the parasitic capacitance $C_{par}$ may be modeled by the gate capacitance of bias transistor $M_1$.

In accordance with the present disclosure, the differential amplifier 300 may further include means for reducing a transconductance of the biasing transistor $M_2$. In some embodiments, for example, the differential amplifier 300 may further include, on the inverting side, a capacitive feedback network 314 electrically connected to the bias transistor $M_2$ to provide a feedback signal (path) 314a between the source S and gate G of bias transistor $M_2$. In some embodiments, for example, the capacitive feedback network 314 may include a feedback capacitor C electrically connected between the source S and gate G of bias transistor $M_2$. The capacitive feedback network 314 may also include a parasitic capacitance $C_{par}$ that represents the parasitic capacitance of bias transistor $M_2$.

A circuit analysis of bias transistor $M_1$ reveals that the feedback signal 312a in the circuit defined by $M_1$ and feedback network 312 yields an effective transconductance $gm_1'$ that can be expressed by the following. A similar analysis applies to bias transistor $M_2$ and feedback signal 314a.

$$g'_{m1} = \frac{C_{par}}{C} g_{m1}, \quad \text{Eqn. 2}$$

where $gm_1'$ is the effective transconductance,
$gm_1$ is the transconductance of $M_1$,
$C_{par}$ represents all the parasitic capacitances of $M_1$, and
$C$ is the capacitance of the feedback capacitor C.

Equation 2 also defines an effective transconductance of bias transistor $M_1$. In particular, the feedback network 312 can reduce the transconductance of bias transistor $M_1$. Stated differently, the feedback network 312 can increase the resistance of bias transistor $M_1$.

Of note is that the effective transconductance $gm_1'$ of bias transistor $M_1$ is only a function of the feedback elements that comprise the feedback network 312. Unlike differential amplifier 200 shown in FIG. 2, the effective transconductance $gm_1'$ of bias transistor $M_1$ can be set without having to bleed off current from current source 202. Accordingly, the effective transconductance $gm_1'$ can be set based only on the capacitance of the feedback capacitor C without affecting the DC bias current through bias transistor $M_1$. The effective transconductance $gm_1'$ can be made small to improve gain performance while at the same time avoiding additional noise and parasitics as compared to the design shown in FIG. 2. The clipping and other non-linear effects may be reduced as compared the design shown in FIG. 2.

Substituting the effective transconductance $gm_1'$ for $gm_1$ into Eqn. 1 yields:

$$I_{out\_1\_sig} = I_{out\ 1} - \frac{g_{m3}}{\frac{C_{par}}{C} g_{m1}} \times I_{m1}, \quad \text{Eqn. 3}$$

$$= I_{out1} - \frac{C}{C_{par}} \times \frac{g_{m3}}{g_{m1}} \times I_{m1}$$

$$I_{m1} = I_{in1} + I_{in\_sig}/2,$$

where $I_{out1\_sig}$ is the output current at the $Out_1$ terminal,
$I_{out1}$ is the quiescent output current at the $Out_1$ terminal,
$I_{out\_sig}$ is the output signal current (FIG. 1B)
$I_{in\_sig}$ is the input signal current (FIG. 1B),
$I_{m1}$ is the current through $M_1$,
$I_{in1}$ is the DC bias current (current source 202),
$gm_1$ is the transconductance of $M_1$, and
$gm_3$ is the transconductance of $M_3$.

It can be seen in Eqn. 3 that the feedback capacitor C can increase the gain by a factor $$\frac{C}{C_{par}}.$$

It is noted here that the gain has been increased without changing the DC bias current through bias transistor $M_1$; in other words, the bleed current $I_{bleed1}$ is not needed. Accordingly, the a gain characteristic of the differential amplifier 300 can be increased without, or least with reduced, distortion effects as compared to differential amplifier 200 in FIG. 2.

Figure 3A:
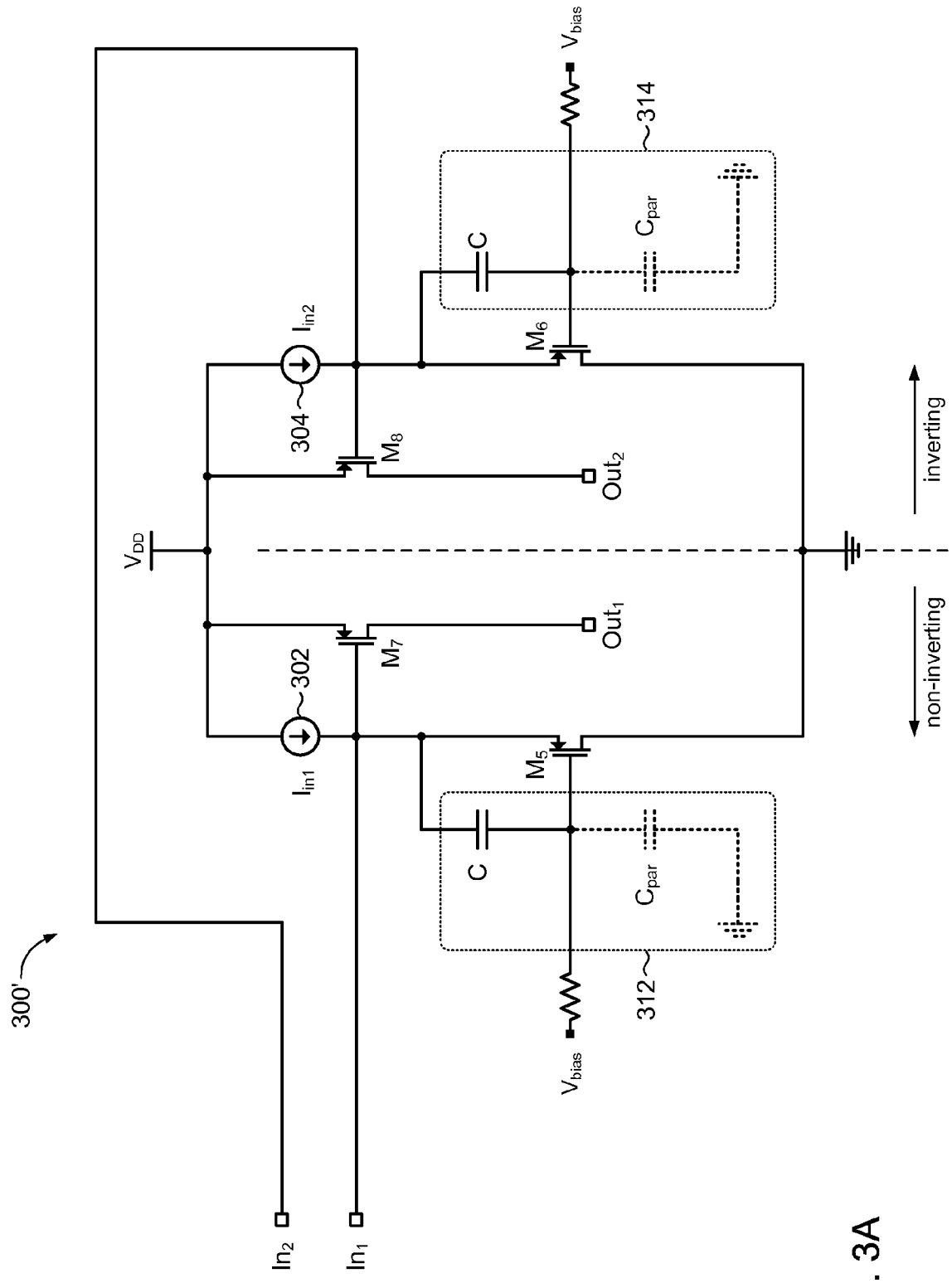

In the particular embodiment of differential amplifier 300 shown in FIG. 3, the transistors $M_1$, $M_2$, $M_3$, $M_4$ are N-type devices. In some embodiments, for example, the transistors $M_1$, $M_2$, $M_3$, $M_4$ may be bipolar NPN devices. In other embodiments, the transistors $M_1$, $M_2$, $M_3$, $M_4$ may be N-channel FETs, N-channel MOSFETs, and so on. One of skill in the art will appreciate that in other embodiments, the transistors $M_1$, $M_2$, $M_3$, $M_4$ may be P-type devices; e.g., bipolar PNP devices, P-channel devices (e.g., FET, MOSFET), etc. FIG. 3A, for example, shows an embodiment of a differential amplifier 300' that uses PMOS devices $M_5$, $M_6$, $M_7$, $M_8$. Elements introduced in FIG. 3 that appear in FIG. 3A may be referenced by the same reference numbers.

Figure 4:
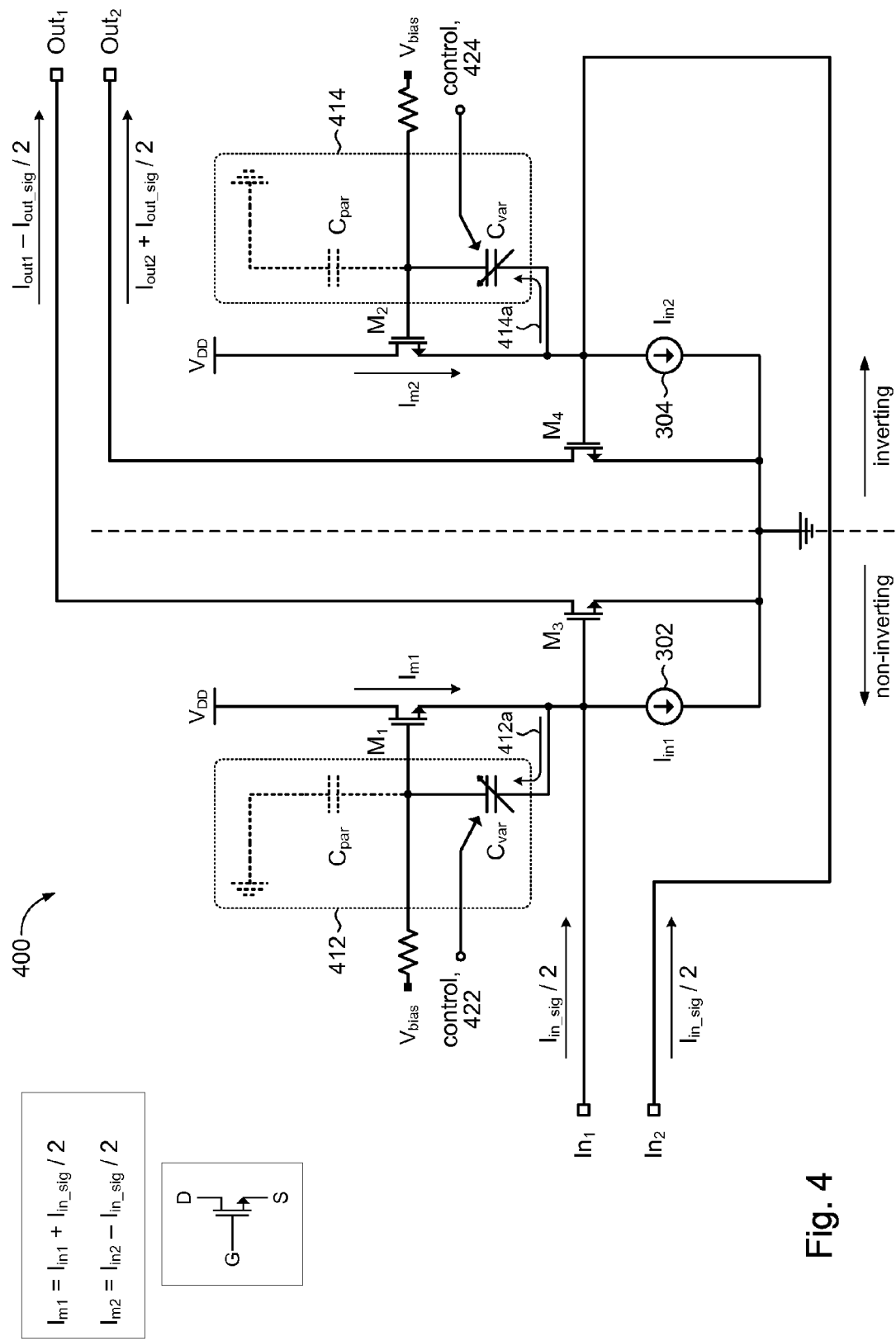
FIGS. 4 and 4A illustrate a differential amplifier design in accordance with further aspects of the present disclosure.

FIG. 4 illustrates a differential amplifier 400 in accordance with the present disclosure. Elements introduced in FIG. 3 that appear in FIG. 4 may be referenced by the same reference numbers. In accordance with some embodiments, differential amplifier 400 may include, on the non-inverting side, a capacitive feedback network 412 electrically connected to the bias transistor $M_1$ to provide a feedback path 412a between the source S and gate G of bias transistor $M_1$. In some embodiments, for example, the capacitive feedback network 412 may include a variable feedback capacitor $C_{var}$ that is electrically connected between the source S and gate G of bias transistor $M_1$. The capacitive feedback network 412 may include the parasitic capacitance $C_{par}$ of bias transistor $M_1$. In some embodiments, the parasitic capacitance $C_{par}$ may be modeled by the gate capacitance of bias transistor $M_1$.

In some embodiments, the differential amplifier 400 may further include, on the inverting side, a capacitive feedback network 414 electrically connected to the bias transistor $M_2$ to provide a feedback path 414a between the source S and gate G of bias transistor $M_2$. In some embodiments, for example, the capacitive feedback network 414 may include a variable feedback capacitor C electrically connected between the source S and gate G of bias transistor $M_2$. The capacitive feedback network 414 may include a parasitic capacitance $C_{par}$ that represents the parasitic capacitance of bias transistor $M_2$.

The capacitance of variable feedback capacitor $C_{var}$ in each capacitive feedback network 412, 414 may be set by a respective control signal 422, 424. In some embodiments, for example, $C_{var}$ may be set during production; e.g., via an interface (not shown) that can access the control signals 422, 424. In other embodiments, logic (not shown) may be provided that can set the values for $C_{var}$ in real time during operation of the differential amplifier 400.

The differential amplifier 400 may be analyzed in the same way as described above in connection with differential amplifier 300 in FIG. 3. The feedback paths 412a, 414a respectively provided by capacitive feedback networks 412, 414 can effectively increase the gain of differential amplifier 400 without having to provide a bleed current as illustrated in FIG. 2. Differential amplifier 400 can therefore realize increased gain without, or least with much reduced, distortion effects.

Figure 4A:
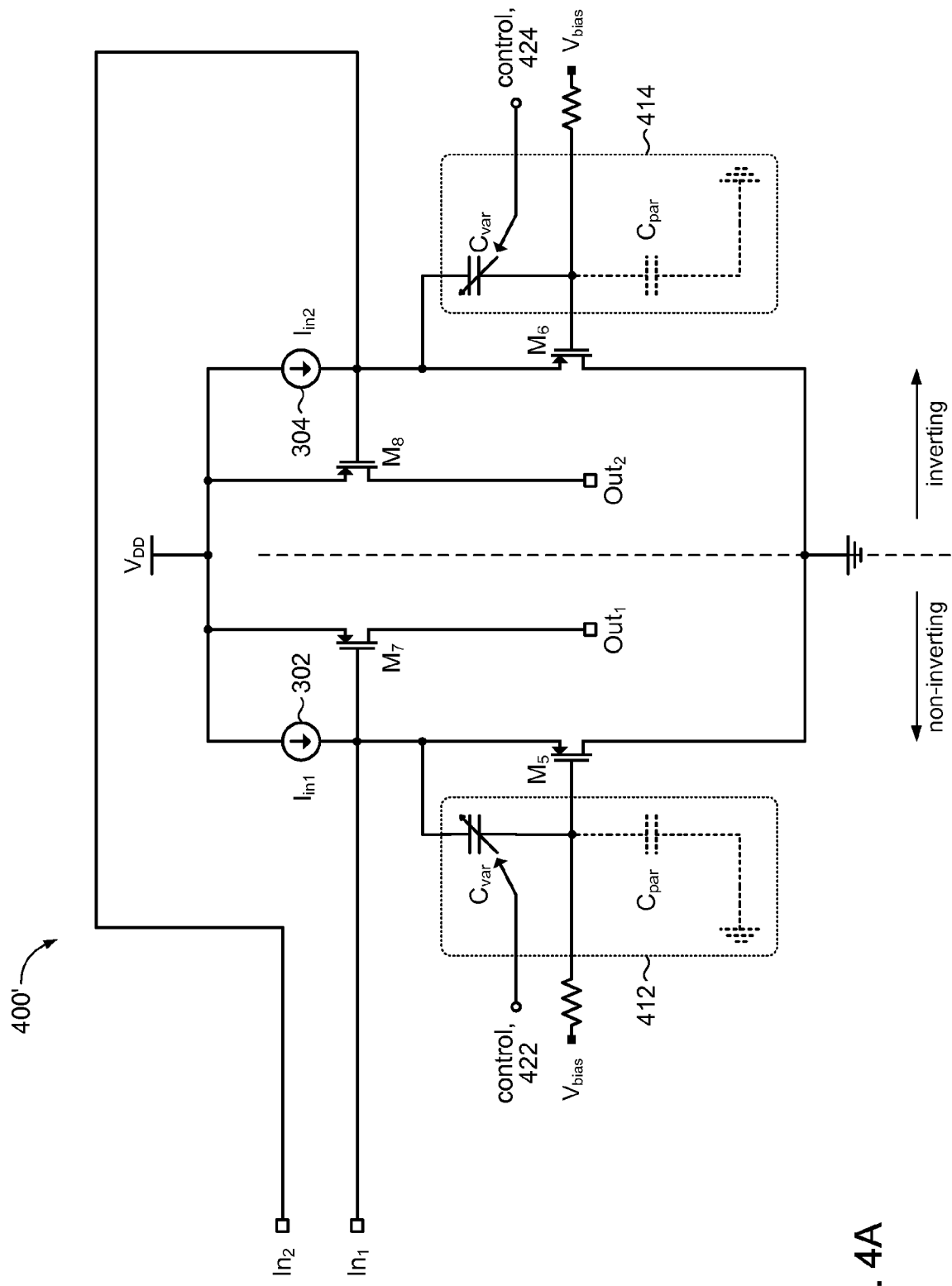

In the particular embodiment of differential amplifier 400 shown in FIG. 4, the transistors $M_1$, $M_2$, $M_3$, $M_4$ are N-type devices. In some embodiments, for example, the transistors M₁, M₂, M₃, M₄ may be bipolar NPN devices. In other embodiments, the transistors M₁, M₂, M₃, M₄ may be N-channel FETs, N-channel MOSFETs, and so on. One of skill in the art will appreciate that in other embodiments, the transistors M₁, M₂, M₃, M₄ may be P-type devices; e.g., bipolar PNP devices, P-channel devices (e.g., FET, MOSFET), etc. FIG. 4A, for example, shows an embodiment of a differential amplifier 400' that uses PMOS devices M₅, M₆, M₇, M₈. Elements introduced in FIGS. 3 and 4 that appear in FIG. 4A may be referenced by the same reference numbers.

Figure 5:
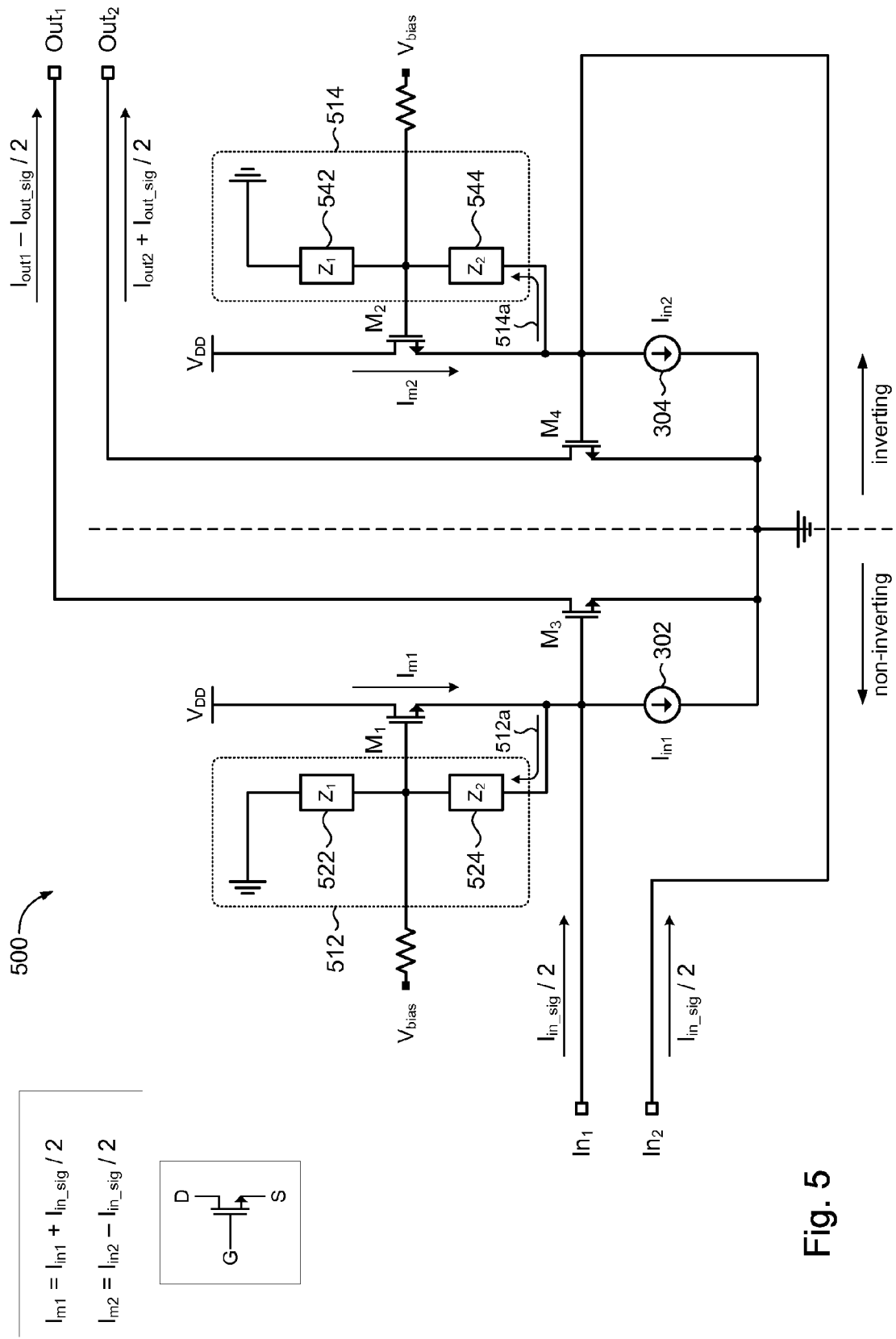
FIGS. 5 and 5A illustrate a differential amplifier design in accordance with still further aspects of the present disclosure.

FIG. 5 illustrates a differential amplifier 500 in accordance with the present disclosure. Elements introduced in FIGS. 3 and 4 that appear in FIG. 5 may be referenced by the same reference numbers. In accordance with some embodiments, differential amplifier 500 may include a feedback network 512 electrically connected to the bias transistor M₁, creating a feedback path 512a between the source S and gate G of bias transistor M₁. In some embodiments, for example, the feedback network 512 may include a suitable network of reactive elements 522, 524 electrically connected between the source S and gate G of bias transistor M₁. The feedback network 512 may be characterized by a feedback gain $G_{fb1}$. In some embodiments, the feedback elements 522, 524 may be reactive elements (e.g., capacitive, inductive). In other embodiments, the feedback elements 522, 524 may be resistive elements, and in still other embodiments, the feedback elements 522, 524 may be a combination of reactive and resistive elements.

On the inverting side, the differential amplifier 500 may further include a feedback network 514 electrically connected to the bias transistor M₂, creating a feedback path 514a between the source S and gate G of bias transistor M₂. In some embodiments, for example, the feedback network 514 may include a suitable network of feedback elements 542, 544 electrically connected between the source S and gate G of bias transistor M₂. The feedback network 514 may be characterized by a feedback gain $G_{fb2}$. In various embodiments, the feedback elements 542, 544 may comprise reactive elements (e.g., capacitive, inductive), resistive elements, or a combination of reactive elements and resistive elements.

It can be appreciated that the differential amplifier embodiments shown in FIGS. 3 and 4 represent specific examples of the more general form of the differential amplifier 500. The gain, for example on the non-inverting side, of differential amplifier 500 may be expressed as follows:

$$I_{out1\_sig} = I_{out1} - G_{fb1} \frac{g_{m3}}{g_{m1}} \times I_{m1}, \quad \text{Eqn. 4}$$

$$I_{m1} = I_{in1} + I_{in\_sig}/2,$$

where $G_{fb1}$ is the feedback gain of the feedback network 512
$I_{out1\_sig}$ is the output current at the Out₁ terminal,
$I_{out1}$ is the quiescent output current at the Out₁ terminal,
$I_{in\_sig}$ is the input signal current (FIG. 1B),
$I_{m1}$ is the current through M₁,
$I_{in1}$ is the DC bias current (current source 202),
$gm_1$ is the transconductance of M₁, and
$gm_3$ is the transconductance of M₃.

Figure 5A:
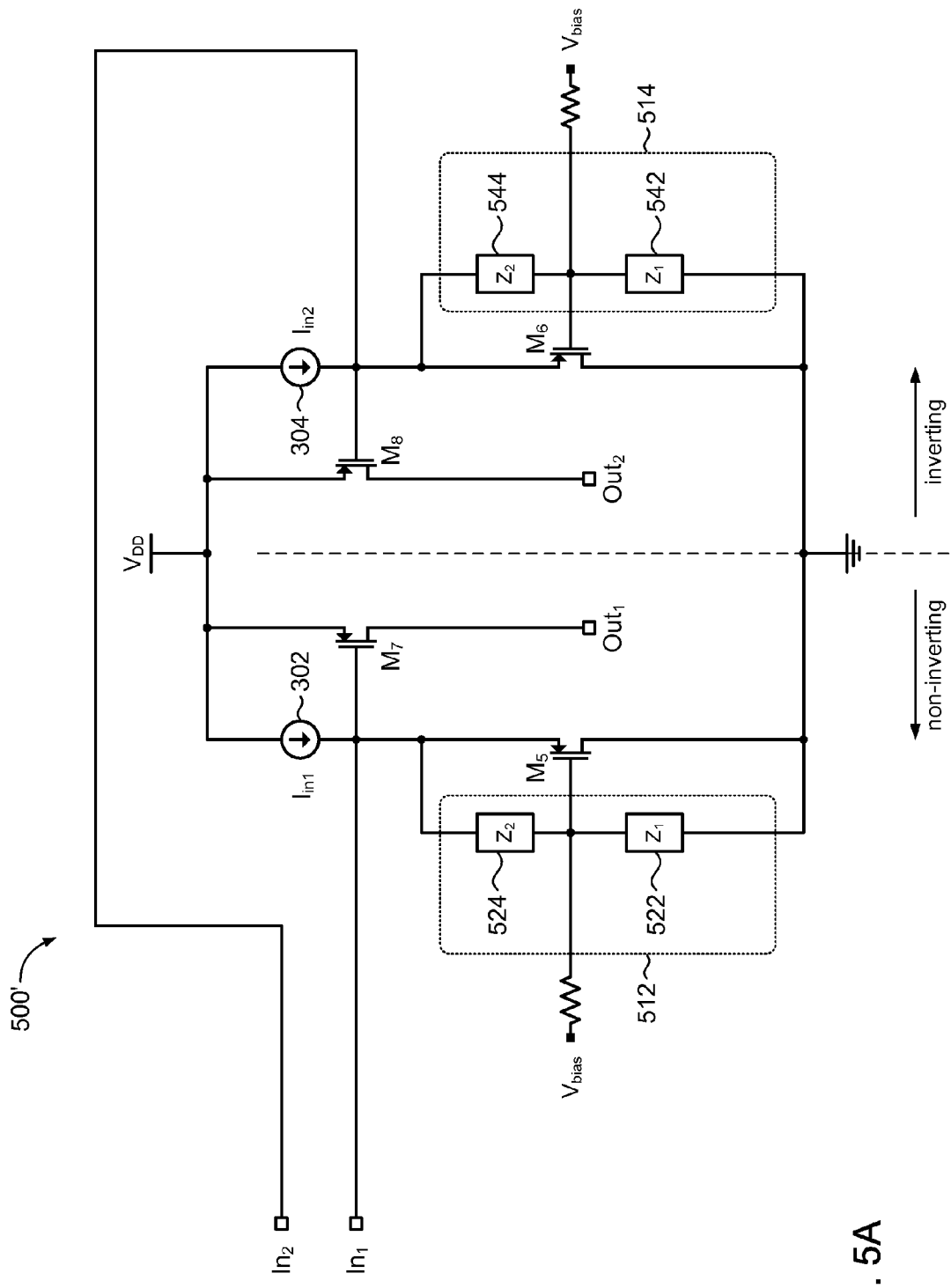

In the particular embodiment of differential amplifier 500 shown in FIG. 5, the transistors M₁, M₂, M₃, M₄ are N-type devices. In some embodiments, for example, the transistors M₁, M₂, M₃, M₄ may be bipolar NPN devices. In other embodiments, the transistors M₁, M₂, M₃, M₄ may be N-channel FETs, N-channel MOSFETs, and so on. One of skill in the art will appreciate that in other embodiments, the transistors M₁, M₂, M₃, M₄ may be P-type devices; e.g., bipolar PNP devices, P-channel devices (e.g., FET, MOSFET), etc. FIG. 5A, for example, shows an embodiment of a differential amplifier 500' that uses PMOS devices M₅, M₆, M₇, M₈. Elements introduced in FIGS. 3-5 that appear in FIG. 5A may be referenced by the same reference numbers.

Advantages of a differential amplifier (e.g., 300, FIG. 3) in accordance with the present disclosure include being able to increase the gain performance of the amplifier without compromising its dynamic performance. The circuit design is considerably simpler. No additional noise or parasitics are introduced at M₁ and M₂. A differential amplifier in accordance with the present disclosure may be suitable for radio frequency transceiver applications. The reduced emissions makes such an amplifier suitable in cellular communication applications; e.g., some industry standards such as Long Term Evolution (LTE) standards have low emissions requirements. A differential amplifier in accordance with the present disclosure can provide increased gain performance without increasing the risk of emissions.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
    a differential stage comprising a first transistor having a control terminal electrically connected to a first differential input and an output terminal electrically connected to a first differential output, the differential stage further comprising a second transistor having a control terminal electrically connected to a second differential input and an output terminal electrically connected to a second differential output;
    a first bias transistor having an output terminal electrically connected to the control terminal of the first transistor, the output terminal being a source terminal of the first bias transistor;
    a second bias transistor having an output terminal electrically connected to the control terminal of the second transistor, the output terminal being a source terminal of the second bias transistor;
    a first feedback network electrically connected between a control terminal and the output terminal of the first bias transistor; and
    a second feedback network electrically connected between a control terminal and the output terminal of the second bias transistor,
    wherein the first and second feedback networks each include a capacitive feedback circuit.

2. The circuit of claim 1, wherein the first and second feedback networks alter respective transconductances of the first and second bias transistors.

3. The circuit of claim 2, wherein the first and second feedback networks reduce the respective transconductances of the first and second bias transistors.

4. The circuit of claim 1, wherein the first and second bias transistors are N-type transistor devices.

5. The circuit of claim 1, wherein the capacitive feedback circuits of the first and second feedback networks, each, includes a variable capacitor.

6. The circuit of claim 1, wherein the capacitive feedback circuit of the first feedback network includes a parasitic capacitance of the first bias transistor, wherein the second feedback network includes a parasitic capacitance of the second bias transistor.

7. The circuit of claim 1, wherein the capacitive feedback circuit of the first feedback network includes a capacitor electrically connected between the control terminal and output terminal of the first bias transistor, wherein an impedance of the first transistor is increased by a factor $$\frac{C}{C_{par}},$$

where C is a capacitance of the capacitor and $C_{par}$ is a parasitic capacitance of the first transistor.

8. A circuit comprising:
a differential stage comprising a first transistor having a control terminal electrically connected to a first differential input and an output terminal electrically connected to a first differential output, the differential stage further comprising a second transistor having a control terminal electrically connected to a second differential input and an output terminal electrically connected to a second differential output;
a first bias transistor having an output terminal electrically connected to the control terminal of the first transistor;
a second bias transistor having an output terminal electrically connected to the control terminal of the second transistor;
a first feedback network electrically connected between a control terminal and the output terminal of the first bias transistor; and
a second feedback network electrically connected between a control terminal and the output terminal of the second bias transistor,
wherein the circuit further comprises a mixer circuit electrically connected to the first and second differential inputs, and a power amplifier electrically connected to the first and second differential outputs.

9. A circuit comprising:
a differential stage comprising a first transistor having a control terminal electrically connected to a first differential input and an output terminal electrically connected to a first differential output, the differential stage further comprising a second transistor having a control terminal electrically connected to a second differential input and an output terminal electrically connected to a second differential output;
a first bias transistor having an output terminal electrically connected to the control terminal of the first transistor;
a second bias transistor having an output terminal electrically connected to the control terminal of the second transistor;
a first feedback network electrically connected between a control terminal and the output terminal of the first bias transistor;
a second feedback network electrically connected between a control terminal and the output terminal of the second bias transistor; and a first current source configured to set a DC operating point of the first transistor and a second current source configured to set a DC operating point of the second transistor.

10. A method in a circuit comprising:
receiving first and second input signals at respective control terminals of first and second transistors of a differential stage;
providing first and second output signals at respective output terminals of the first and second transistors;
biasing the first transistor using a first biasing signal provided at an output terminal of a first biasing transistor, the output terminal being a source terminal of the first biasing transistor;
biasing the second transistor using a second biasing signal provided at an output terminal of a second biasing transistor, the output terminal being a source terminal of the second biasing transistor;
providing a feedback signal between the output terminal of the first biasing transistor and a control terminal of the first biasing transistor using a capacitive feedback network; and
reducing, based on the feedback signal, a transconductance of the first biasing transistor and a transconductance of the second biasing transistor to increase a gain characteristic of the differential stage.

11. The method of claim 10, wherein the capacitive feedback network comprises a capacitor electrically connected between a control terminal and the output terminal of the first bias transistor, wherein an impedance of the first transistor is increased by a factor $$\frac{C}{C_{par}},$$

where C is a capacitance of the capacitor and $C_{par}$ is a parasitic capacitance of the first transistor.

12. The method of claim 11, wherein the capacitor is a variable capacitor.

13. A method in a circuit comprising:
receiving first and second input signals at respective control terminals of first and second transistors of a differential stage;
providing first and second output signals at respective output terminals of the first and second transistors;
biasing the first transistor using a first biasing transistor;
biasing the second transistor using a second biasing transistor;
reducing a transconductance of the first biasing transistor and a transconductance of the second biasing transistor to increase a gain characteristic of the differential stage; and
receiving the first and second input signals from a mixer circuit and providing the first and second output signals to a power amplifier.

14. A circuit comprising:
means for receiving first and second input signals at respective control terminals of first and second transistors of a differential stage;
means for providing first and second output signals at respective output terminals of the first and second transistors;
means for biasing the first transistor using a first biasing signal provided at an output terminal of a first biasing transistor, the output terminal being a source terminal of the first biasing transistor;

means for biasing the second transistor using a second biasing signal provided at an output terminal of a second biasing transistor, the output terminal being a source terminal of the second biasing transistor; and means for reducing a transconductance of the first biasing transistor and means for reducing a transconductance of the second biasing transistor to increase a gain characteristic of the differential stage, wherein the means for reducing the transconductance of the first biasing transistor comprises a capacitive feedback network.

15. The circuit of claim 14, wherein the capacitive feedback network provides a feedback signal between the output terminal of the first biasing transistor and a control terminal of the first biasing transistor.

16. The circuit of claim 14, wherein the capacitive feedback network comprises a capacitor electrically connected between a control terminal and the output terminal of the first bias transistor, wherein an impedance of the first transistor is increased by a factor $$\frac{C}{C_{par}},$$

where C is a capacitance of the capacitor and $C_{par}$ is a parasitic capacitance of the first transistor.

17. The circuit of claim 16, wherein the capacitor is a variable capacitor.

18. A circuit comprising:

means for receiving first and second input signals at respective control terminals of first and second transistors of a differential stage;

means for providing first and second output signals at respective output terminals of the first and second transistors;

means for biasing the first transistor using a first biasing transistor;

means for biasing the second transistor using a second biasing transistor;

means for reducing a transconductance of the first biasing transistor and means for reducing a transconductance of the second biasing transistor to increase a gain characteristic of the differential stage;

a mixer circuit electrically connected to the means for receiving first and second input signals; and a power amplifier electrically connected to the means for providing first and second output signals.

* * * * *